(12) United States Patent
Wang (10) Patent No.: US 6,850,093 B1
(45) Date of Patent: Feb. 1, 2005

(54) CIRCUIT AND METHOD FOR IMPROVING NOISE TOLERANCE IN MULTI-THREADED MEMORY CIRCUITS

(75) Inventor: Lei Wang, Fort Collins, CO (US)

(73) Assignee: Hewlett-Packard Development Company, L.P., Houston, TX (US)

(*) Notice: Subject to any disclaimer, the term of this patent is extended or adjusted under 35 U.S.C. 154(b) by 24 days.

(21) Appl. No.: 10/629,239

(22) Filed: Jul. 28, 2003

(51) Int. Cl.[7] ............................................. H03K 19/00
(52) U.S. Cl. ............................. 326/93; 326/95; 326/98
(58) Field of Search ..................................... 326/93–98

(56) References Cited

U.S. PATENT DOCUMENTS 6,420,903 B1 * 7/2002 Singh et al. .................. 326/93
6,629,236 B1 * 9/2003 Aipperspach et al. ....... 712/228

* cited by examiner

*Primary Examiner*—Anh Q. Tran
(74) *Attorney, Agent, or Firm*—John Pessetto (57) ABSTRACT

An embodiment of the invention provides a circuit and method for improving noise tolerance in multi-threaded memory circuits. A PFET is added to the receiving input of each memory cell. The gate of the PFET is connected to the output of the memory cell and the source of the PFET is connected to the control signal of the memory cell. In the case where the dataline is charged near ground and a memory cell, with a high value, is read, and the control signal is high, noise tolerance is improved by the addition of the PFET to the memory cell. The invention does not introduce additional drive fights during writes, when the control signal is low.

36 Claims, 4 Drawing Sheets

CIRCUIT AND METHOD FOR IMPROVING NOISE TOLERANCE IN MULTI-THREADED MEMORY CIRCUITS

FIELD OF THE INVENTION

This invention relates generally to integrated circuit design. More particularly, this invention relates to improving noise tolerance in multi-threaded memory circuits.

BACKGROUND OF THE INVENTION

In the context of digital circuits, noise is defined as any deviation of a signal from its stable value in those subintervals of time when it should otherwise be stable. Noise in digital circuits can be attributed to several sources such as leakage noise, charge-sharing noise, cross-talk noise, power supply noise, shot noise, thermal noise, and flicker noise. Rigorous noise analysis and noise considerations during design are becoming increasingly important.

The current capability of a MOSFET (Metal Oxide Semiconductor Field, Effect Transistor) is inversely proportional to a MOSFET's length. As a result, more current may be sourced by an individual MOSFET by reducing the length of the MOSFET. However, as the length of a MOSFET is reduced, other problems are created. For example, the threshold voltage may be lowered, resulting in higher levels of leakage current. In addition, leakage current of a MOSFET may introduce noise into a circuit by leaking charge from a node that would ideally retain its initial charge.

Charge-sharing may be used in a positive manner. DRAMs (Dynamic Random Access Memory) use the principle of charge-sharing to create dense memory devices. DRAMs store an individual data bit by either storing more charge on a capacitor or storing less charge on a capacitor. A DRAM reads data by measuring the change in voltage on a bitline when the charge on a capacitor is charge-shared with the charge on the bitline. However, unwanted charge-sharing between memory elements may cause correct data stored in a memory element to "flip" to incorrect data.

One embodiment of this invention reduces the likelihood that charge-sharing between multi-threaded memory cells will cause incorrect data to be stored in a memory cell. The implementation of this embodiment does not create additional drive fights when the multi-threaded memory cells are written. In addition, charge loss in multi-threaded memory devices due to leakage is reduced by an embodiment of the invention. A detailed description of one embodiment of this invention is described later.

SUMMARY OF THE INVENTION

An embodiment of the invention provides a circuit and method for improving noise tolerance in multi-threaded memory circuits. A PFET is added to the receiving input of each memory cell. The gate of the PFET is connected to the output of the memory cell and the source of the PFET is connected to a control signal of the memory cell. In the case where the dataline is charged near ground by a memory cell of one thread and a memory cell of another thread, with a high value, is read, noise tolerance is improved by the addition of the PFET to the memory cell.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1:
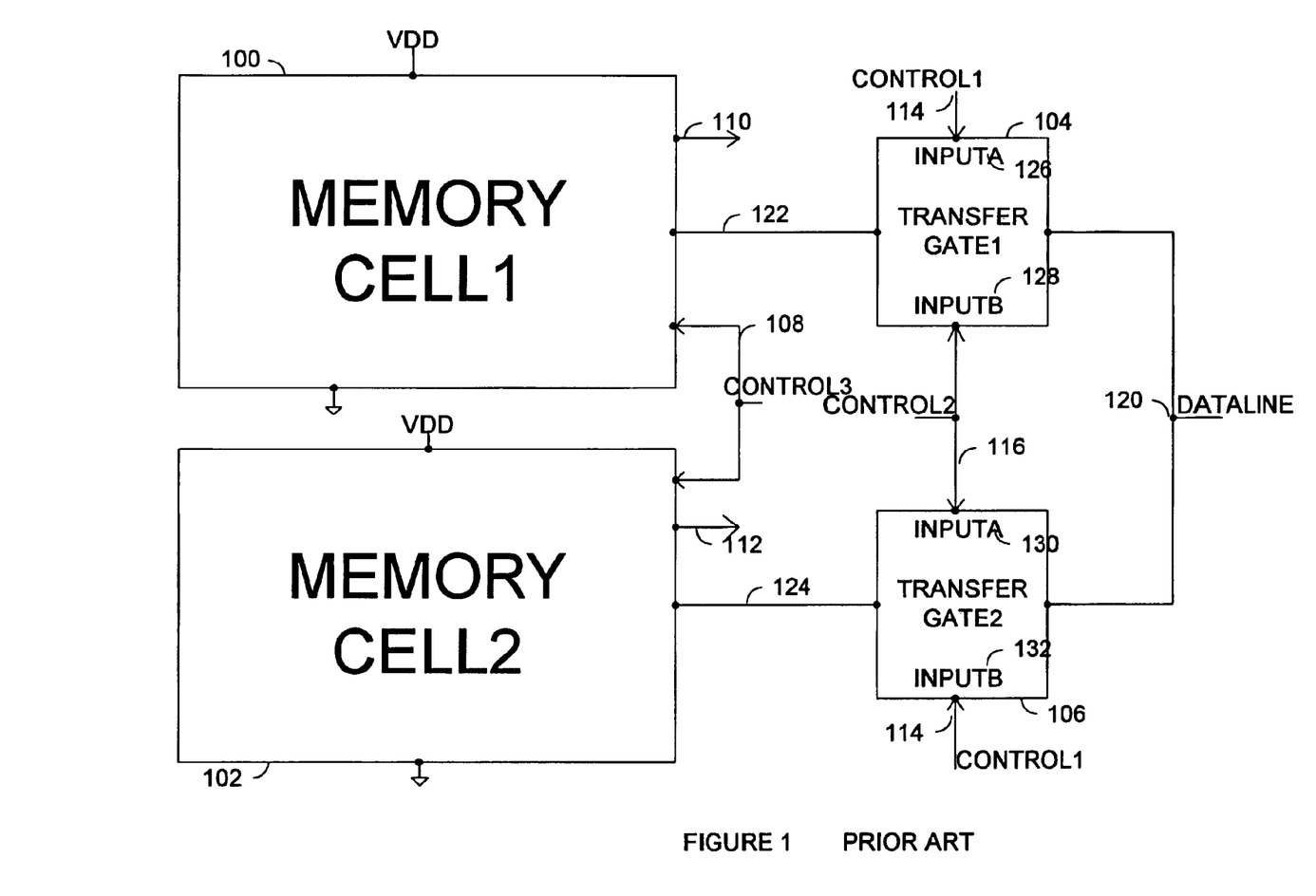
FIG. 1 is a block diagram of a multi-threaded memory circuit. Prior Art

FIG. 1 is a block diagram of a multi-threaded memory circuit. Memory cell1, 100, has an output, 110, a receiving input, 122, a control input, CONTROL3 108 and is connected to VDD and GND. Memory cell2, 102, has an output, 112, a receiving input, 124, a control input, CONTROL3, 108 and is connected to VDD and GND. Transfer gate1, 104, has an 10 (input/output), 122, an inputa, 126, an inputb, 128, and an 110, 120. Transfer gate2, 106, has an I/O (input/output), 124, an inputa, 130, an inputb, 132, and an 110, 120. Receiving input, 122 of memory cell1, 100, is connected to I/O, 122, of transfer gate1, 104. Receiving input, 124 of memory cell2, 102, is connected to I/O, 124, of transfer gate2, Control signal, CONTROL1, 114, is connected to inputa, 126, of transfer gate1, 104 and to inputb, 132, of transfer gate2, 106. Control signal, CONTROL2, 116, is connected to inputb, 128, of transfer gate1, 104 and to inputa, 130, of transfer gate2, 106. A dataline, 120, is connected to I/O, 120, of transfer gate1, 104 and transfer gate2, 106.

One type of noise, charge-sharing, may occur in the multi-threaded memory shown in FIG. 1. For example, when the dataline, 120, is charged near GND, by memory cell 2, 102, the receiving input 122 is held near VDD, and transfer gate1, 104, briefly connects dataline, 120, to receiving input 122 to read the value of memory cell1, 100, some charge on receiving input 122 may be transferred to dataline 120. During this time, node 124 is disconnected from dataline, 120. If enough charge is transferred, the "high" value stored on the memory cell1, 100, may "flip" to a "low". If the value stored on the memory cell1, 100 flips to a low from a high, an incorrect value may be stored on memory cell1, 100. In this example, only one transfer gate is on at any one time.

Another example of noise due to charge-sharing may occur when the dataline, 120, is charged near GND, by memory cell1, 100, the receiving input 124 is held near VDD, and transfer gate2, 106, briefly connects dataline, 120, to receiving input 124, to read the value of memory cell2, 102. During this time, node 122 is disconnected from dataline, 120. Some charge on receiving input 124 may be transferred to dataline 120. If enough charge is transferred, the "high" value stored on the memory cell2, 102, may "flip" to a "low". If the value stored on the memory cell2, 102 flips to a low from a high, an incorrect value may be stored on memory cell2, 102. In this example, only one transfer gate is on at any one time.

Figure 2:
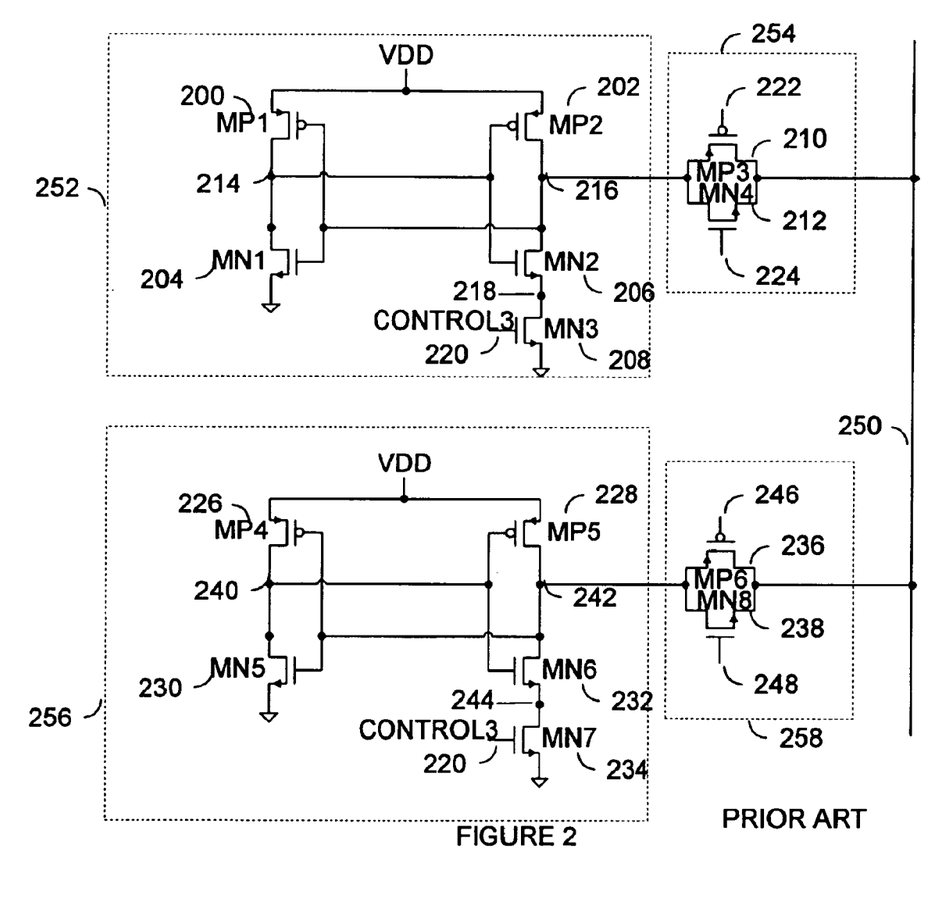
FIG. 2 is a schematic drawing of a multi-threaded memory circuit. Prior Art

FIG. 2 is a schematic drawing of a multi-threaded memory circuit. Memory cell1, 252, contains PFET, MP1, 200, with its source connected to VDD, its drain, 2114, connected to the gate, 214 of PFET, MP2, 202, the gate, 214 of NFET, MN2, 206, and the drain, 214 of NFET MN 1, 204.

Memory cell1, 252 also contains PFET, MP2, 202, with its source connected to VDD, its drain, 216, connected to the gate, 216 of PFET, MP1, 200, the gate, 216, of NFET, MN1, 204, and the drain, 216 of NFET MN2, 206. In addition, the source of NFET, MN1, 204 is connected to GND. The source 218, of NFET, MN2, 206, is connected to the drain, 218, of NFET, MN3, 208. The gate, 220, of NFET, MN3, 208 is connected to CONTROL3, 220 and the source of NFET, MN3, 208, is connected to GND.

Memory cell2, 256, contains PFET, MP4, 226, with its source connected to VDD, its drain, 240, connected to the gate, 240 of PFET, MP5, 228, the gate, 240 of NFET, MN6, 232, and the drain, 240 of NFET MN5, 230. Memory cell2, 256 also contains PFET, MP5, 228, with its source connected to VDD, its drain, 242, connected to the gate, 242 of PFET, MP4, 226, the gate, 242, of NFET, MN5, 230, and the drain, 240 of NFET MN6, 232. In addition, the source of NFET, MN5, 230 is connected to GND. The source 244, of NFET, MN6, 232, is connected to the drain, 244, of NFET, MN7, 234. The gate, 220, of NFET, MN7, 234 is connected to CONTROL3, and the source of NFET, MN7, 234, is connected to GND.

Transfer gate1, 254 contains PFET, MP3, 210, with its source connected to 216, its drain connected to 250, and its gate connected to 222. Transfer gate1, 254 also contains, NFET, MN4, 212, with its drain connected to 216, its source connected to 250, and its gate connected to 224.

Transfer gate2, 258 contains PFET, MP6, 236, with its source connected to 242, its drain connected to 250, and its gate connected to 246. Transfer gate2, 258 also contains, NFET, MN8, 238, with its drain connected to 242, its source connected to 250, and its gate connected to 248.

One type of noise, charge-sharing, may occur in the multi-threaded memory shown in FIG. 2. For example, when the dataline, 250, is charged near GND, by memory cell2, 256, the receiving input 216 is held near VDD, the gate, 222, of PFET MP3, 210, is briefly held low, and the gate, 224, of NFET MN4, 212 is briefly held high to read the value on receiving input, 216, some charge on receiving input 216 may be transferred to dataline 250. During this time, node 246 is held hight and node 248 is held low. If enough charge is transferred, the high value stored on the memory cell1, 252, may "flip" to a low. If the value stored on the memory cell1, 252 flips to a low from a high, an incorrect value may be stored on memory cell1, 252. In this example, only one transfer gate is on at any one time.

Charge-sharing, may also occur in another way in the multi-threaded memory shown in FIG. 2. For example, when the dataline, 250, is charged near GND, by memory cell1, 252, the receiving input 242 is held near VDD, the gate, 246, of PFET MP6, 236, is briefly held low, and the gate, 248, of NFET MN8, 238 is briefly held high to read the value on receiving input, 242, some charge on receiving input 242 may be transferred to dataline 250. During this time, node 222 is held high and node 224 is held low. If enough charge is transferred, the high value stored on the memory cell2, 256, may "flip" to a low. If the value stored on the memory cell2, 256 flips to a low from a high, an incorrect value may be stored on memory cell2, 256. In this example, only one transfer gate is on at any one time.

Figure 3:
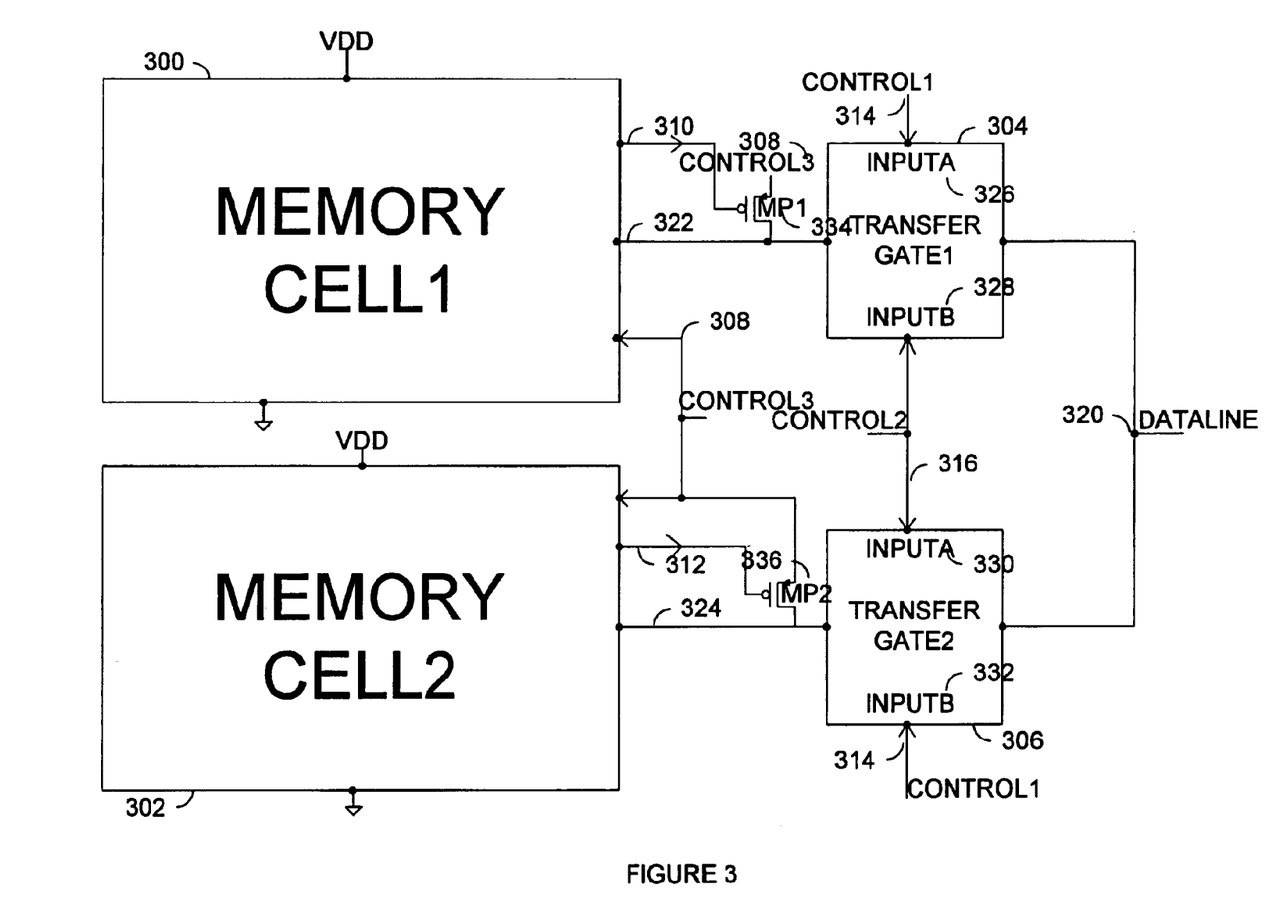
FIG. 3 is a block diagram of an embodiment of a multi-threaded memory circuit with improved noise tolerance.

FIG. 3 is a block diagram of an embodiment of a multi-threaded memory circuit with improved noise tolerance. Memory cell1, 300, has an output, 310, a receiving input, 322, a control input, CONTROL3, 308 and is connected to VDD and GND. Memory cell2, 302, has an output, 312, a receiving input, 324, a control input, CONTROL3, 308 and is connected to VDD and GND. Transfer gate1, 304, has an I/O (input/output), 322, an inputa, 326, an inputb, 328, and an I/O, 320. Transfer gate2, 306, has an I/O (input/output), 324, an inputa, 330, an inputb, 332, and an I/O, 320. Receiving input, 322 of memory cell1, 300, is connected to 110, 322, of transfer gate1, 304. Receiving input, 324 of memory cell2, 302, is connected to I/O, 324, of transfer gate2, 306. Control signal, CONTROL1, 314, is connected to inputa, 326, of transfer gate1, 304 and to inputb, 332, of transfer gate2, 306. Control signal, CONTROL2, 316, is connected to inputb, 328, of transfer gate1, 304 and to inputa, 330, of transfer gate2, 306. A dataline, 320, is connected to an 10, 320, of transfer gate1, 304 and transfer gate2, 306. The source of PFET, MP1, 334, is connected to CONTROL3, 308. The gate of PFET, MP1, 334, is connected to the output, 310, of memory cell, 300. The drain of PFET, MP1, 334 is connected to the receiving input, 322, of memory cell1, 300. The source of PFET, MP2, 336, is connected to CONTROL3, 308. The gate of PFET, MP2, 336, is connected to the output, 312, of memory cell2, 302. The drain of PFET, MP2, 336 is connected to the receiving input, 324, of memory cell1, 302.

One type of noise, charge-sharing, is reduced in the multi-threaded memory shown in FIG. 3. For example, when the dataline, 320, is charged near GND by memory cell2, 302, the receiving input 322 is held near VDD, and transfer gate1, 304, briefly connects dataline, 320, to receiving input 322 to read the value of memory cell1, 300, some charge on receiving input 322 may be transferred to dataline 320. During this time, CONTROL2, 316 is held high and CONTROL1, 314 is held low. The transferred charge is compensated for by the PFET, MP1, 334. In this case, the voltage on CONTROL3, 308, is near VDD and the memory cell1 output, 310 is near GND. As a consequence, the PFET, MP1, 334, is on and recharges most charge lost to charging-sharing with the dataline, 320. The addition of PFET, MP1, 334, does not introduce any additional drive fights when CONTROL3, 308, is held low.

Another example of how noise due to charge-sharing may be reduced occurs when the dataline, 320, is charged near GND by memory cell1, 300, the receiving input 324 is held near VDD, and transfer gate2, 306, briefly connects dataline, 320, to receiving input 324 to read the value of memory cell2, 302, some charge on receiving input 324 may be transferred to dataline 320. During this time, CONTROL2, 314 is held high and CONTROL1, 316 is held low. This transferred charge is compensated for by the PFET, MP2, 336. In this case, the voltage on CONTROL3, 308, is near VDD and the memory cell2 output, 312 is near GND. As a consequence, the PFET, MP2, 336, is on and recharges most charge lost to charging-sharing with the dataline, 320. The addition of PFET, MP2, 336, does not introduce any additional drive fights when CONTROL3, 308, is held low.

Figure 4:
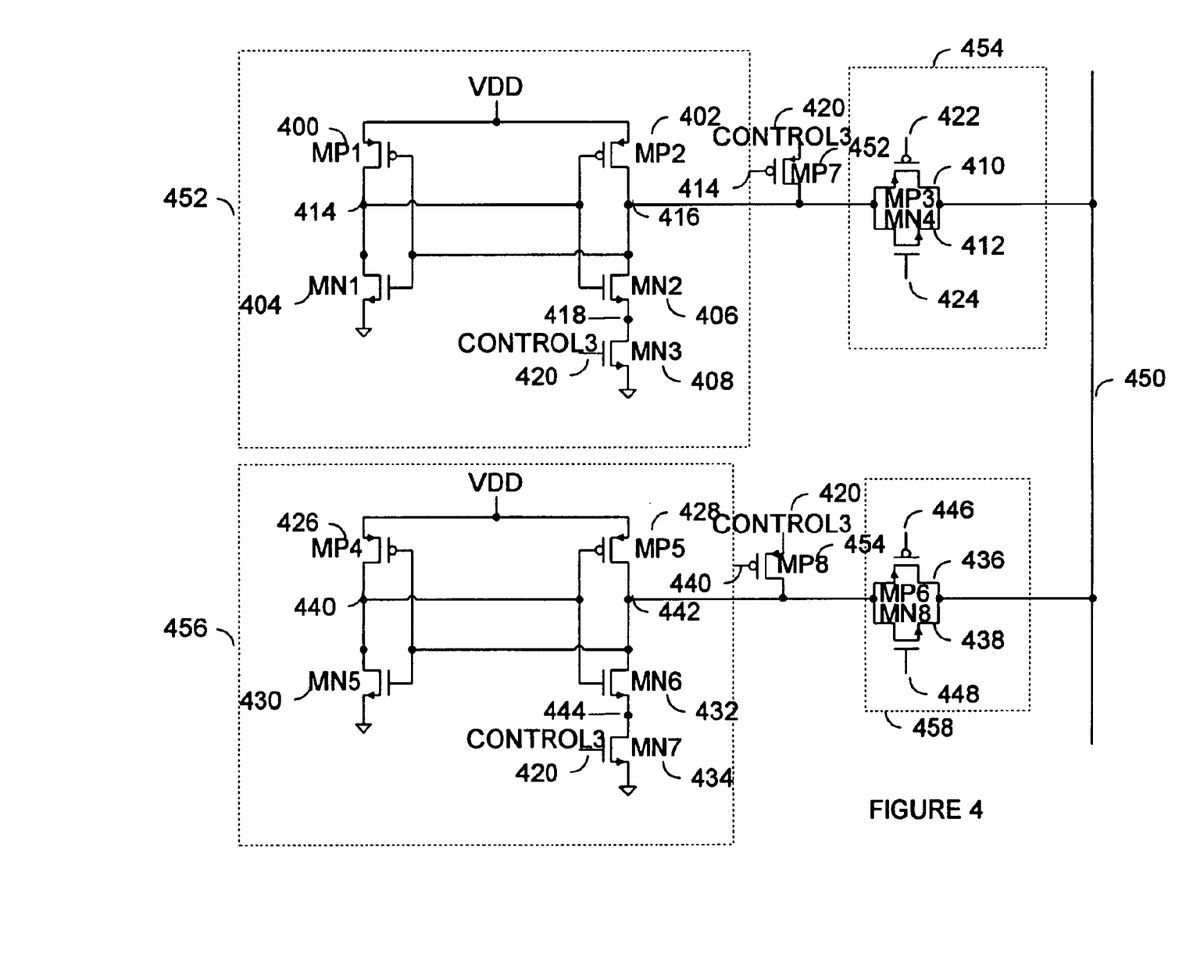
FIG. 4 is a schematic drawing of an embodiment of a multi-threaded memory circuit with improved noise tolerance.

FIG. 4 is a schematic drawing of one embodiment of a multi-threaded memory circuit with improved noise tolerance. Memory cell1, 452, contains PFET, MP1, 400, with its source connected to VDD, its drain, 414, connected to the gate, 414 of PFET, MP2, 402, the gate, 414 of NFET, MN2, 406, and the drain, 414 of NFET MN1, 404. Memory cell1, 452 also contains PFET, MP2, 402, with its source connected to VDD, its drain, 416, connected to the gate, 416 of PFET, MP1, 400, the gate, 416, of NFET, MN1, 404, and the drain, 416 of NFET MN2, 406. In addition, the source of NFET, MN1, 404 is connected to GND. The source 418, of NFET, MN2, 406, is connected to the drain, 418, of NFET, MN3, 408. The gate, 420, of NFET, MN3, 408 is connected to CONTROL3, 420, and the source of NFET, MN3, 408, is connected to GND.

Memory cell2, 456, contains PFET, MP4, 426, with its source connected to VDD, its drain, 440, connected to the gate, 440 of PFET, MP5, 428, the gate, 440 of NFET, MN6, 432, and the drain, 440 of NFET MN5, 430. Memory cell2, 256 also contains PFET, MP5, 428, with its source connected to VDD, its drain, 442, connected to the gate, 442 of PFET, MP4, 426, the gate, 442, of NFET, MN5, 430, and the drain, 440 of NFET MN6, 432. In addition, the source of NFET, MN5, 430 is connected to GND. The source 444, of NFET, MN6, 432, is connected to the drain, 444, of NFET, MN7, 434. The gate, 420, of NFET, MN7, 434 is connected to CONTROL3, and the source of NFET, MN7, 434, is connected to GND.

Transfer gate1, 454 contains PFET, MP3, 410, with its source connected to 416, its drain connected to 450, and its gate connected to 422. Transfer gate1, 454 also contains, NFET, MN4, 412, with its drain connected to 416, its source connected to 450, and its gate connected to 424. The source, 420, of PFET, MP7, 452, is connected to CONTROL3. The gate, 414, of PFET, MP7, 452, is connected to the output of memory cell1, 452. The drain, 416, of PFET, MP7, 452, is connected to the receiving input of memory cell1, 452.

Transfer gate2, 458 contains PFET, MP6, 436, with its source connected to 442, its drain connected to 450, and its gate connected to 446. Transfer gate2, 458 also contains, NFET, MN8, 438, with its drain connected to 442, its source connected to 450, and its gate connected to 448. The source, 420, of PFET, MP8, 454, is connected to CONTROL3. The gate, 440, of PFET, MP8, 454, is connected to the output of memory cell2, 456. The drain, 442, of PFET, MP8, 454, is connected to the receiving input of memory cell2, 456.

One type of noise, charge-sharing, is reduced in the multi-threaded memory shown in FIG. 4. For example, when the dataline, 450, is charged near GND by memory cell2, 456, the receiving input 416 is held near VDD, the gate, 422, of PFET MP3, 410, is briefly held low, and the gate, 424, of NFET MN4, 412 is briefly held high to read the value on the receiving input, 416, some charge on receiving input 416 may be transferred to dataline 450. During this time, node 446 is held high and node 448 is held low. This transferred charge is compensated for by the PFET, MF7, 452. In this case, the voltage on CONTROL3, 420, is near VDD and the memory cell1output, 414 is near GND. As a consequence, the PFET, MP7, 452, is on and recharges most of the charge lost to charging-sharing with the dataline, 450. The addition of PFET, MF7, 452, does not introduce any additional drive fights when CONTROL3, 420, is held low.

Another example of how noise due to charge-sharing may be reduced occurs when the dataline, 450, is charged near GND by memory cell1, 452, the receiving input 442 is held near VDD, the gate, 446, of PFET MP6, 436, is briefly held low, and the gate, 448, of NFET MN8, 438 is briefly held high to read the value on the receiving input, 442, some charge on receiving input 442 may be transferred to dataline 450. During this time, node 422 is held high and node 424 is held low. This transferred charge is compensated for by the PFET, MP8, 454. In this case, the voltage on CONTROL3, 420, is near VDD and the memory cell2 output, 440 is near GND. As a consequence, the PFET, MP8, 454, is on and recharges most of the charge lost to charging-sharing with the dataline, 450. The addition of PFET, MP8, 454, does not introduce any additional drive fights when CONTROL3, 420, is held low.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A circuit for improving noise tolerance in multi-threaded memory circuits comprising:
    (a) a first PFET with a source, drain, and gate;
    (b) a second PFET with a source, drain, and gate;
    (c) a first memory cell connected to VDD and GND, with a receiving input, an output, and a control input;
    (d) a second memory cell connected to VDD and GND, with a receiving input, an output, and a control input;
    (e) a first transfer gate with an input, a first control input, a second control input and an output;
    (f) a second transfer gate with an input, a first control input, a second control input and an output;
    (g) wherein the gate of the first PFET is connected to the output of the first memory cell, the drain of the first PFET is connected to the receiving input of the first memory cell, and the source of the first PFET is connected to the control input of the first memory cell;
    (h) wherein the gate of the second PFET is connected to the output of the second memory cell, the drain of the second PFET is connected to the receiving input of the second memory cell, and the source of the second PFET is connected to the control input of the second memory cell;
    (i) wherein the output of the first transfer gate is connected to the receiving input of the first memory cell and the drain of the first PFET, the first control input of the first transfer gate is connected to a first control signal, the second control input of the first transfer gate is connected to a second control signal and the input of the first transfer gate is connected to a dataline and the input of the second transfer gate;
    (j) wherein the output of the second transfer gate is connected to the receiving input of the second memory cell and the drain of the second PFET, the first control input of the second transfer gate is connected to the second control signal, the second control input of the second transfer gate is connected to the first control signal and the input of the second transfer gate is connected to the dataline and the input of the first transfer gate;
    (k) such that when the dataline is charged to near GND, the voltage stored on the receiving input of the first memory cell is high, the voltages on the control inputs of the first transfer gate connect the dataline to the receiving input of the first memory cell, and the voltage to the control input of the first and second memory cells is high, the first PFET improves the noise immunity of the first memory cell.

2. The circuit as in claim 1 wherein the first transfer gate comprises:
    (a) a PFET with a source, drain, and gate;
    (b) an NFET with a source, drain and gate;
    (c) wherein the drain of the PFET and the source of the NFET are connected to the input of the first transfer gate;

(d) wherein the source of the PFET and the drain of the NFET are connected to the output of the first transfer gate;

(e) wherein the gate of the PFET is connected to the first control input of the first transfer gate;

(f) wherein the gate of the NFET is connected to the second control input of the first transfer gate;

(g) wherein the first control signal has the opposite phase of the second control signal.

3. The circuit as in claim 1 wherein the second transfer gate comprises:

(a) a PFET with a source, drain, and gate;

(b) an NFET with a source, drain and gate;

(c) wherein the drain of the PFET and the source of the NFET are connected to the input of the second transfer gate;

(d) wherein the source of the PFET and the drain of the NFET are connected to the output the second transfer gate;

(e) wherein the gate of the PFET is connected to the first control input of the second transfer gate;

(f) wherein the gate of the NFET is connected to the second control input of the second transfer gate;

(g) wherein the first control signal has the opposite phase of the second control signal.

4. The circuit as in claim 3 wherein the first transfer gate comprises:

(a) a PFET with a source, drain, and gate;

(b) an NFET with a source, drain and gate;

(c) wherein the drain of the PFET and the source of the NFET are connected to the input of the first transfer gate;

(d) wherein the source of the PFET and the drain of the NFET are connected to the output of the first transfer gate;

(e) wherein the gate of the PFET is connected to the first control input of the first transfer gate;

(f) wherein the gate of the NFET is connected to the second control input of the first transfer gate;

(g) wherein the first control signal has the opposite phase of the second control signal.

5. The circuit as in claim 1 wherein the first memory cell comprises:

(a) a first PFET with a source, drain, and gate;

(b) a first NFET with a source, drain and gate;

(c) a second PFET with a source, drain, and gate;

(d) a second NFET with a source, drain and gate;

(e) a third NFET with a source, drain and gate;

(f) wherein the sources of first and second PFETs are connected to VDD;

(g) wherein the drain of the first PFET, the gate of the second PFET, and the gate of the second NFET are connected to the output of the first memory cell;

(h) wherein the drain of the second PFET, the gate of the first PFET, and the gate of the first NFET are connected to the receiving input of the first memory cell;

(i) wherein the source of the first NFET is connected to GND;

(j) wherein the source of the second NFET is connected to the drain of the third NFET;

(k) wherein the gate of the third NFET is connected to the control input and the source of the third NFET is connected to GND.

6. The circuit as in claim 1 wherein the second memory cell comprises:

(a) a first PFET with a source, drain, and gate;

(b) a first NFET with a source, drain and gate;

(c) a second PFET with a source, drain, and gate;

(d) a second NFET with a source, drain and gate;

(e) a third NFET with a source, drain and gate;

(f) wherein the sources of first and second PFETs are connected to VDD;

(g) wherein the drain of the first PFET, the gate of the second PFET, and the gate of the second NFET are connected to the output of the second memory cell;

(h) wherein the drain of the second PFET, the gate of the first PFET, and the gate of the first NFET are connected to the receiving input of the second memory cell;

(i) wherein the source of the first NFET is connected to GND;

(j) wherein the source of the second NFET is connected to the drain of the third NFET;

(k) wherein the gate of the third NFET is connected to the control input and the source of the third NFET is connected to GND.

7. The circuit as in claim 6 wherein the first memory cell comprises:

(a) a first PFET with a source, drain, and gate;

(b) a first NFET with a source, drain and gate;

(c) a second PFET with a source, drain, and gate;

(d) a second NFET with a source, drain and gate;

(e) a third NFET with a source, drain and gate;

(f) wherein the sources of first and second PFETs are connected to VDD;

(g) wherein the drain of the first PFET, the gate of the second PFET, and the gate of the second NFET are connected to the output of the first memory cell;

(h) wherein the drain of the second PFET, the gate of the first PFET, and the gate of the first NFET are connected to the receiving input of the first memory cell;

(i) wherein the source of the first NFET is connected to GND;

(j) wherein the source of the second NFET is connected to the drain of the third NFET;

(k) wherein the gate of the third NFET is connected to the control input and the source of the third NFET is connected to GND.

8. The circuit as in claim 7 wherein the first transfer gate comprises:

(a) a PFET with a source, drain, and gate;

(b) an NFET with a source, drain and gate;

(c) wherein the drain of the PFET and the source of the NFET are connected to the input of the first transfer gate;

(d) wherein the source of the PFET and the drain of the NFET are connected to the output of the first transfer gate;

(e) wherein the gate of the PFET is connected to the first control input of the first transfer gate;

(f) wherein the gate of the NFET is connected to the second control input of the first transfer gate;

(g) wherein the first control signal has the opposite phase of the second control signal.

9. The circuit as in claim 8 wherein the second transfer gate comprises:

(a) a PFET with a source, drain, and gate;
(b) an NFET with a source, drain and gate;
(c) wherein the drain of the PFET and the source of the NFET are connected to the input of the second transfer gate;
(d) wherein the source of the PFET and the drain of the NFET are connected to the output the second transfer gate;
(e) wherein the gate of the PFET is connected to the first control input of the second transfer gate;
(f) wherein the gate of the NFET is connected to the second control input of the second transfer gate;
(g) wherein the first control signal has the opposite phase of the second control signal.

10. A method for improving noise tolerance in multi-threaded memory circuits comprising:
(a) fabricating a first PFET with a source, drain, and gate;
(b) fabricating a second PFET with a source, drain, and gate;
(c) fabricating a first memory cell connected to VDD and GND, with a receiving input, an output, and a control input;
(d) fabricating a second memory cell connected to VDD and GND, with a receiving input, an output, and a control input;
(e) fabricating a first transfer gate with an input, a first control input, a second control input and an output;
(f) fabricating a second transfer gate with an input, a first control input, a second control input and an output;
(g) wherein the gate of the first PFET is connected to the output of the first memory cell, the drain of the first PFET is connected to the receiving input of the first memory cell, and the source of the first PFET is connected to the control input of the first memory cell;
(h) wherein the gate of the second PFET is connected to the output of the second memory cell, the drain of the second PFET is connected to the receiving input of the second memory cell, and the source of the second PFET is connected to the control input of the second memory cell;
(i) wherein the output of the first transfer gate is connected to the receiving input of the first memory cell and the drain of the first PFET, the first control input of the first transfer gate is connected to a first control signal, the second control input of the first transfer gate is connected to a second control signal and the input of the first transfer gate is connected to a dataline and the input of the second transfer gate;
(j) wherein the output of the second transfer gate is connected to the receiving input of the second memory cell and the drain of the second PFET, the first control input of the second transfer gate is connected to the second control signal, the second control input of the second transfer gate is connected to the first control signal and the input of the second transfer gate is connected to the dataline and the input of the first transfer gate;
(k) such that when the dataline is charged to near GND, the voltage stored on the receiving input of the first memory cell is high, the voltages on the control inputs of the first transfer gate connect the dataline to the receiving input of the first memory cell, and the voltage to the control input of the first and second memory cells is high, the first PFET improves the noise immunity of the first memory cell.

11. The method as in claim 10 wherein the first transfer gate comprises:
(a) fabricating a PFET with a source, drain, and gate;
(b) fabricating an NFET with a source, drain and gate;
(c) wherein the drain of the PFET and the source of the NFET are connected to the input of the first transfer gate;
(d) wherein the source of the PFET and the drain of the NFET are connected to the output of the first transfer gate;
(e) wherein the gate of the PFET is connected to the first control input of the first transfer gate;
(f) wherein the gate of the NFET is connected to the second control input of the first transfer gate;
(g) wherein the first control signal has the opposite phase of the second control signal.

12. The method as in claim 10 wherein the second transfer gate comprises:
(a) fabricating a PFET with a source, drain, and gate;
(b) fabricating an NFET with a source, drain and gate;
(c) wherein the drain of the PFET and the source of the NFET are connected to the input of the second transfer gate;
(d) wherein the source of the PFET and the drain of the NFET are connected to the output the second transfer gate;
(e) wherein the gate of the PFET is connected to the first control input of the second transfer gate;
(f) wherein the gate of the NFET is connected to the second control input of the second transfer gate;
(g) wherein the fist control signal has the opposite phase of the second control signal.

13. The method as in claim 12 wherein the first transfer gate comprises:
(a) fabricating a PFET with a source, drain, and gate;
(b) fabricating an NFET with a source, drain and gate;
(c) wherein the drain of the PFET and the source of the NFET are connected to the input of the first transfer gate;
(d) wherein the source of the PFET and the drain of the NFET are connected to the output of the first transfer gate;
(e) wherein the gate of the PFET is connected to the first control input of the first transfer gate;
(f) wherein the gate of the NFET is connected to the second control input of the first transfer gate;
(g) wherein the first control signal has the opposite phase of the second control signal.

14. The method as in claim 10 wherein the first memory cell comprises:
(a) fabricating a first PFET with a source, drain, and gate;
(b) fabricating a first NFET with a source, drain and gate;
(c) fabricating a second PFET with a source, drain, and gate;
(d) fabricating a second NFET with a source, drain and gate;
(e) fabricating a third NFET with a source, drain and gate;
(f) wherein the sources of first and second PFETs are connected to VDD;
(g) wherein the drain of the first PFET, the gate of the second PFET, and the gate of the second NFET are connected to the output of the first memory cell;

(h) wherein the drain of the second PFET, the gate of the first PFET, and the gate of the first NFET are connected to the receiving input of the first memory cell;

(i) wherein the source of the first NFET is connected to GND;

(j) wherein the source of the second NFET is connected to the drain of the third NFET;

(k) wherein the gate of the third NFET is connected to the control input and the source of the third NFET is connected to GND.

15. The method as in claim 10 wherein the second memory cell comprises:

(a) fabricating a first PFET with a source, drain, and gate;

(b) fabricating a first NFET with a source, drain and gate;

(c) fabricating a second PFET with a source, drain, and gate;

(d) fabricating a second NFET with a source, drain and gate;

(e) fabricating a third NFET with a source, drain and gate;

(f) wherein the sources of first and second PFETs are connected to VDD;

(g) wherein the drain of the first PFET, the gate of the second PFET, and the gate of the second NFET are connected to the output of the second memory cell;

(h) wherein the drain of the second PFET, the gate of the first PFET, and the gate of the first NFET are connected to the receiving input of the second memory cell;

(i) wherein the source of the first NFET is connected to GND;

(j) wherein the source of the second NFET is connected to the drain of the third NFET;

(k) wherein the gate of the third NFET is connected to the control input and the source of the third NFET is connected to GND.

16. The method as in claim 15 wherein the first memory cell comprises:

(a) fabricating a first PFET with a source, drain, and gate;

(b) fabricating a first NFET with a source, drain and gate;

(c) fabricating a second PFET with a source, drain, and gate;

(d) fabricating a second NFET with a source, drain and gate;

(e) fabricating a third NFET with a source, drain and gate;

(f) wherein the sources of first and second PFETs are connected to VDD;

(g) wherein the drain of the first PFET, the gate of the second PFET, and the gate of the second NFET are connected to the output of the first memory cell;

(h) wherein the drain of the second PFET, the gate of the first PFET, and the gate of the first NFET are connected to the receiving input of the first memory cell;

(i) wherein the source of the first NFET is connected to GND;

(j) wherein the source of the second NFET is connected to the drain of the third NFET;

(k) wherein the gate of the third NFET is connected to the control input and the source of the third NFET is connected to GND.

17. The method as in claim 16 wherein the first transfer gate comprises:

(a) a PFET with a source, drain, and gate;

(b) an NFET with a source, drain and gate;

(c) wherein the drain of the PFET and the source of the NFET are connected to the input of the first transfer gate;

(d) wherein the source of the PFET and the drain of the NFET are connected to the output of the first transfer gate;

(e) wherein the gate of the PFET is connected to the first control input of the first transfer gate;

(f) wherein the gate of the NFET is connected to the second control input of the first transfer gate;

(g) wherein the first control signal has the opposite phase of the second control signal.

18. The method as in claim 17 wherein the second transfer gate comprises:

(a) a PFET with a source, drain, and gate;

(b) an NFET with a source, drain and gate;

(c) wherein the drain of the PFET and the source of the NFET are connected to the input of the second transfer gate;

(d) wherein the source of the PFET and the drain of the NFET are connected to the output the second transfer gate;

(e) wherein the gate of the PFET is connected to the first control input of the second transfer gate;

(f) wherein the gate of the NFET is connected to the second control input of the second transfer gate;

(g) wherein the first control signal has the opposite phase of the second control signal.

19. A circuit for improving noise tolerance in multi-threaded memory circuits comprising:

(a) a first PFET with a source, drain, and gate;

(b) a second PFET with a source, drain, and gate;

(c) a first memory cell connected to VDD and GND, with a receiving input, an output, and a control input;

(d) a second memory cell connected to VDD and GND, with a receiving input, an output, and a control input;

(e) a first transfer gate with an input, a first control input, a second control input and an output;

(f) a second transfer gate with an input, a first control input, a second control input and an output;

(g) wherein the gate of the first PFET is connected to the output of the first memory cell, the drain of the first PFET is connected to the receiving input of the first memory cell, and the source of the first PFET is connected to the control input of the first memory cell;

(h) wherein the gate of the second PFET is connected to the output of the second memory cell, the drain of the second PFET is connected to the receiving input of the second memory cell, and the source of the second PFET is connected to the control input of the second memory cell;

(i) wherein the output of the first transfer gate is connected to the receiving input of the first memory cell and the drain of the first PFET, the first control input of the first transfer gate is connected to a first control signal, the second control input of the first transfer gate is connected to a second control signal and the input of the first transfer gate is connected to a dataline and the input of the second transfer gate;

(j) wherein the output of the second transfer gate is connected to the receiving input of the second memory cell and the drain of the second PFET, the first control input of the second transfer gate is connected to the second control signal, the second control input of the second transfer gate is connected to the first control signal and the input of the second transfer gate is connected to the dataline and the input of the first transfer gate;

(k) such that when the dataline is charged to near GND, the voltage stored on the receiving input of the second memory cell is high, the voltages on the control inputs of the second transfer gate connect the dataline to the receiving input of the second memory cell, and the voltage to the control input of the first and second memory cells is high, the second PFET improves the noise immunity of the second memory cell.

20. The circuit as in claim 19 wherein the first transfer gate comprises:

(a) a PFET with a source, drain, and gate;
(b) an NFET with a source, drain and gate;
(c) wherein the drain of the PFET and the source of the NFET are connected to the input of the first transfer gate;
(d) wherein the source of the PFET and the drain of the NFET are connected to the output of the first transfer gate;
(e) wherein the gate of the PFET is connected to the first control input of the first transfer gate;
(f) wherein the gate of the NFET is connected to the second control input of the first transfer gate;
(g) wherein the first control signal has the opposite phase of the second control signal.

21. The circuit as in claim 19 wherein the second transfer gate comprises:

(a) a PFET with a source, drain, and gate;
(b) an NFET with a source, drain and gate;
(c) wherein the drain of the PFET and the source of the NFET are connected to the input of the second transfer gate;
(d) wherein the source of the PFET and the drain of the NFET are connected to the output the second transfer gate;
(e) wherein the gate of the PFET is connected to the first control input of the second transfer gate;
(f) wherein the gate of the NFET is connected to the second control input of the second transfer gate;
(g) wherein the first control signal has the opposite phase of the second control signal.

22. The circuit as in claim 21 wherein the first transfer gate comprises:

(a) a PFET with a source, drain, and gate;
(b) an NFET with a source, drain and gate;
(c) wherein the drain of the PFET and the source of the NFET are connected to the input of the first transfer gate;
(d) wherein the source of the PFET and the drain of the NFET are connected to the output of the first transfer gate;
(e) wherein the gate of the PFET is connected to the first control input of the first transfer gate;
(f) wherein the gate of the NFET is connected to the second control input of the first transfer gate;
(g) wherein the first control signal has the opposite phase of the second control signal.

23. The circuit as in claim 19 wherein the first memory cell comprises:

(a) a first PFET with a source, drain, and gate;
(b) a first NFET with a source, drain and gate;
(c) a second PFET with a source, drain, and gate;
(d) a second NFET with a source, drain and gate;
(e) a third NFET with a source, drain and gate;
(f) wherein the sources of first and second PFETs are connected to VDD;
(g) wherein the drain of the first PFET, the gate of the second PFET, and the gate of the second NFET are connected to the output of the first memory cell;
(h) wherein the drain of the second PFET, the gate of the first PFET, and the gate of the first NFET are connected to the receiving input of the first memory cell;
(i) wherein the source of the first NFET is connected to GND;
(j) wherein the source of the second NFET is connected to the drain of the third NFET;
(k) wherein the gate of the third NFET is connected to the control input and the source of the third NFET is connected to GND.

24. The circuit as in claim 19 wherein the second memory cell comprises:

(a) a first PFET with a source, drain, and gate;
(b) a first NFET with a source, drain and gate;
(c) a second PFET with a source, drain, and gate;
(d) a second NFET with a source, drain and gate;
(e) a third NFET with a source, drain and gate;
(f) wherein the sources of first and second PFETs are connected to VDD;
(g) wherein the drain of the first PFET, the gate of the second PFET, and the gate of the second NFET are connected to the output of the second memory cell;
(h) wherein the drain of the second PFET, the gate of the first PFET, and the gate of the first NFET are connected to the receiving input of the second memory cell;
(i) wherein the source of the first NFET is connected to GND;
(j) wherein the source of the second NFET is connected to the drain of the third NFET;
(k) wherein the gate of the third NFET is connected to the control input and the source of the third NFET is connected to GND.

25. The circuit as in claim 24 wherein the first memory cell comprises:

(a) a first PFET with a source, drain, and gate;
(b) a first NFET with a source, drain and gate;
(c) a second PFET with a source, drain, and gate;
(d) a second NFET with a source, drain and gate;
(e) a third NFET with a source, drain and gate;
(f) wherein the sources of first and second PFETs are connected to VDD;
(g) wherein the drain of the first PFET, the gate of the second PFET, and the gate of the second NFET are connected to the output of the first memory cell;
(h) wherein the drain of the second PFET, the gate of the first PFET, and the gate of the first NFET are connected to the receiving input of the first memory cell;
(i) wherein the source of the first NFET is connected to GND;
(j) wherein the source of the second NFET is connected to the drain of the third NFET;

(k) wherein the gate of the third NFET is connected to the control input and the source of the third NFET is connected to GND.

26. The circuit as in claim 25 wherein the first transfer gate comprises:
   (a) a PFET with a source, drain, and gate;
   (b) an NFET with a source, drain and gate;
   (c) wherein the drain of the PFET and the source of the NFET are connected to the input of the first transfer gate;
   (d) wherein the source of the PFET and the drain of the NFET are connected to the output of the first transfer gate;
   (e) wherein the gate of the PFET is connected to the first control input of the first transfer gate;
   (f) wherein the gate of the NFET is connected to the second control input of the first transfer gate;
   (g) wherein the first control signal has the opposite phase of the second control signal.

27. The circuit as in claim 26 wherein the second transfer gate comprises:
   (a) a PFET with a source, drain, and gate;
   (b) an NFET with a source, drain and gate;
   (c) wherein the drain of the PFET and the source of the NFET are connected to the input of the second transfer gate;
   (d) wherein the source of the PFET and the drain of the NFET are connected to the output the second transfer gate;
   (e) wherein the gate of the PFET is connected to the first control input of the second transfer gate;
   (f) wherein the gate of the NFET is connected to the second control input of the second transfer gate;
   (g) wherein the first control signal has the opposite phase of the second control signal.

28. A method for improving noise tolerance in multi-threaded memory circuits comprising:
   (a) fabricating a first PFET with a source, drain, and gate;
   (b) fabricating a second PFET with a source, drain, and gate;
   (c) fabricating a first memory cell connected to VDD and GND, with a receiving input, an output, and a control input;
   (d) fabricating a second memory cell connected to VDD and GND, with a receiving input, an output, and a control input;
   (e) fabricating a first transfer gate with an input, a first control input, a second control input and an output;
   (f) fabricating a second transfer gate with an input, a first control input, a second control input and an output;
   (g) wherein the gate of the first PFET is connected to the output of the first memory cell, the drain of the first PFET is connected to the receiving input of the first memory cell, and the source of the first PFET is connected to the control input of the first memory cell;
   (h) wherein the gate of the second PFET is connected to the output of the second memory cell, the drain of the second PFET is connected to the receiving input of the second memory cell, and the source of the second PFET is connected to the control input of the second memory cell;
   (i) wherein the output of the first transfer gate is connected to the receiving input of the first memory cell and the drain of the first PFET, the first control input of the first transfer gate is connected to a first control signal, the second control input of the first transfer gate is connected to a second control signal and the input of the first transfer gate is connected to a dataline and the input of the second transfer gate;
   (j) wherein the output of the second transfer gate is connected to the receiving input of the second memory cell and the drain of the second PFET, the first control input of the second transfer gate is connected to the second control signal, the second control input of the second transfer gate is connected to the first control signal and the input of the second transfer gate is connected to the dataline and the input of the first transfer gate;
   (k) such that when the dataline is charged to near GND, the voltage stored on the receiving input of the second memory cell is high, the voltages on the control inputs of the second transfer gate connect the dataline to the receiving input of the second memory cell, and the voltage to the control input of the first and second memory cells is high, the second PFET improves the noise immunity of the second memory cell.

29. The method as in claim 28 wherein the first transfer gate comprises:
   (a) fabricating a PFET with a source, drain, and gate;
   (b) fabricating an NFET with a source, drain and gate;
   (c) wherein the drain of the PFET and the source of the NFET are connected to the input of the first transfer gate;
   (d) wherein the source of the PFET and the source of the NFET are connected to the output of the first transfer gate;
   (e) wherein the gate of the PFET is connected to the first control input of the first transfer gate;
   (f) wherein the gate of the NFET is connected to the second control input of the first transfer gate;
   (g) wherein the first control signal has the opposite phase of the second control signal.

30. The method as in claim 28 wherein the second transfer gate comprises:
   (a) fabricating a PFET with a source, drain, and gate;
   (b) fabricating an NFET with a source, drain and gate;
   (c) wherein the drain of the PFET and the source of the NFET are connected to the input of the second transfer gate;
   (d) wherein the source of the PFET and the drain of the NFET are connected to the output the second transfer gate;
   (e) wherein the gate of the PFET is connected to the first control input of the second transfer gate;
   (f) wherein the gate of the NFET is connected to the second control input of the second transfer gate;
   (g) wherein the first control signal has the opposite phase of the second control signal.

31. The method as in claim 30 wherein the first transfer gate comprises:
   (a) fabricating a PFET with a source, drain, and gate;
   (b) fabricating an NFET with a source, drain and gate;
   (c) wherein the drain of the PFET and the source of the NFET are connected to the input of the first transfer gate;
   (d) wherein the source of the PFET and the drain of the NFET are connected to the output of the first transfer gate;

(e) wherein the gate of the PFET is connected to the first control input of the first transfer gate;

(f) wherein the gate of the NFET is connected to the second control input of the first transfer gate;

(g) wherein the first control signal has the opposite phase of the second control signal.

32. The method as in claim 28 wherein the first memory cell comprises:

(a) fabricating a first PFET with a source, drain, and gate;

(b) fabricating a first NFET with a source, drain and gate;

(c) fabricating a second PFET with a source, drain, and gate;

(d) fabricating a second NFET with a source, drain and gate;

(e) fabricating a third NFET with a source, drain and gate;

(f) wherein the sources of first and second PFETs are connected to VDD;

(g) wherein the drain of the first PFET, the gate of the second PFET, and the gate of the second NFET are connected to the output of the first memory cell;

(h) wherein the drain of the second PFET, the gate of the first PFET, and the gate of the first NFET are connected to the receiving input of the first memory cell;

(i) wherein the source of the first NFET is connected to GND;

(j) wherein the source of the second NFET is connected to the drain of the third NFET;

(k) wherein the gate of the third NFET is connected to the control input and the source of the third NFET is connected to GND.

33. The method as in claim 28 wherein the second memory cell comprises:

(a) fabricating a first PFET with a source, drain, and gate;

(c) fabricating a first NFET with a source, drain and gate;

(c) fabricating a second PFET with a source, drain, and gate;

(d) fabricating a second NFET with a source, drain and gate;

(e) fabricating a third NFET with a source, drain and gate;

(f) wherein the sources of first and second PFETs are connected to VDD;

(g) wherein the drain of the first PFET, the gate of the second PFET, and the gate of the second NFET are connected to the output of the second memory cell;

(h) wherein the drain of the second PFET, the gate of the first PFET, and the gate of the first NFET are connected to the receiving input of the second memory cell;

(i) wherein the source of the first NFET is connected to GND;

(j) wherein the source of the second NFET is connected to the drain of the third NFET;

(k) wherein the gate of the third NFET is connected to the control input and the source of the third NFET is connected to GND.

34. The method as in claim 33 wherein the first memory cell comprises:

(a) fabricating a first PFET with a source, drain, and gate;

(b) fabricating a first NFET with a source, drain and gate;

(c) fabricating a second PFET with a source, drain, and gate;

(d) fabricating a second NFET with a source, drain and gate;

(e) fabricating a third NFET with a source, drain and gate;

(f) wherein the sources of first and second PFETs are connected to VDD;

(g) wherein the drain of the first PFET, the gate of the second PFET, and the gate of the second NFET are connected to the output of the first memory cell;

(h) wherein the drain of the second PFET, the gate of the first PFET, and the gate of the first NFET are connected to the receiving input of the first memory cell;

(i) wherein the source of the first NFET is connected to GND;

(j) wherein the source of the second NFET is connected to the drain of the third NFET;

(k) wherein the gate of the third NFET is connected to the control input and the source of the third NFET is connected to GND.

35. The method as in claim 34 wherein the first transfer gate comprises:

(a) a PFET with a source, drain, and gate;

(b) an NFET with a source, drain and gate;

(c) wherein the drain of the PFET and the source of the NFET are connected to the input of the first transfer gate;

(d) wherein the source of the PFET and the drain of the NFET are connected to the output of the first transfer gate;

(e) wherein the gate of the PFET is connected to the first control input of the first transfer gate;

(f) wherein the gate of the NFET is connected to the second control input of the first transfer gate;

(g) wherein the first control signal has the opposite phase of the second control signal.

36. The method as in claim 35 wherein the second transfer gate comprises:

(a) a PFET with a source, drain, and gate;

(b) an NFET with a source, drain and gate;

(c) wherein the drain of the PFET and the source of the NFET are connected to the input of the second transfer gate;

(d) wherein the source of the PFET and the drain of the NFET are connected to the output the second transfer gate;

(e) wherein the gate of the PFET is connected to the first control input of the second transfer gate;

(f) wherein the gate of the NFET is connected to the second control input of the second transfer gate;

(g) wherein the first control signal has the opposite phase of the second control signal.

* * * * *